United States Patent [19]
Reich et al.

[11] Patent Number: 6,077,932
[45] Date of Patent: Jun. 20, 2000

[54] POLYMERS OF 2,7-DIOXABICYCLO[3.2.1] OCTANE DERIVATIVES

[75] Inventors: Wolfgang Reich, Maxdorf; Reinhold Schwalm, Wachenheim; Lukas Häussling, Bad Dürkheim; Oskar Nuyken, München, all of Germany; Roman-Benedikt Raether, Austin, Tex.

[73] Assignee: BASF Aktiengesellschaft, Ludwigshafen, Germany

[21] Appl. No.: 09/101,304

[22] PCT Filed: Apr. 4, 1997

[86] PCT No.: PCT/EP97/01689

§ 371 Date: Jul. 13, 1998

§ 102(e) Date: Jul. 13, 1998

[87] PCT Pub. No.: WO97/39047

PCT Pub. Date: Oct. 23, 1997

[30] Foreign Application Priority Data

Apr. 13, 1996 [DE] Germany .................. 196 14 635

[51] Int. Cl.$^7$ .................................. C08G 59/00
[52] U.S. Cl. ........................... 528/403; 528/417
[58] Field of Search ........................ 528/403, 417

[56] References Cited

PUBLICATIONS

"Polymerization of bicyclic acetals", Hirasawa et al, Macromolecules, ed 21, Nr. 6, p 1566 (1988).

"Sterically Controlled cationic Propagation ...", Sumitomo et al, Die Macromolecules Chemie, Nr. 6, p 11, 1986.

*Primary Examiner*—Edward J. Cain
*Attorney, Agent, or Firm*—Oblon, Spivak, McClelland, Maier & Neustadt, P.C.

[57] ABSTRACT

Polymers are obtainable by polymerising or copolymerising 2,7-dioxabicyclo[3.2.1]octane derivatives of the formula

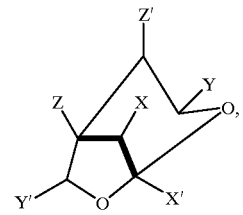

I in which X, X', Y, Y', Z and Z' each independently are a $C_1$–$C_2$ hydrocarbon radical or hydrogen.

16 Claims, No Drawings

POLYMERS OF 2,7-DIOXABICYCLO[3.2.1] OCTANE DERIVATIVES

The invention relates to polymers obtainable by polymerizing or copolymerizing 2,7-dioxabicyclo[3.2.1]octane derivatives of the formula

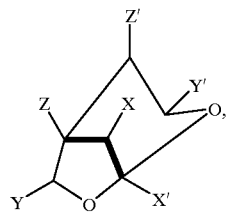

I where X, X', Y, Y', Z and Z' each independently are a $C_1$–$C_{20}$ hydrocarbon radical or hydrogen.

The invention also relates to the use of polymers for producing coatings and moldings, especially including structured coatings and moldings.

The production of coatings and moldings by subjecting free-radically or cationically polymerizable compounds to radiation curing is a matter of general knowledge. The radiation curing of acrylate compounds has acquired particular industrial importance. In the case of acrylate compounds, however, there is the fundamental problem that the photopolymerization is inhibited by oxygen.

The search is therefore on for monomers, especially cationically polymerizable monomers, that are suitable for producing coatings and moldings.

Also of industrial importance are structured (patterned) coatings and moldings, such as printed circuit boards, printing plates, etc.

For producing such structured systems use is made in particular of photoresists, i.e. coatings whose solubility changes on irradiation with high-energy light. Controlled irradiation and subsequent removal of the compounds that have become soluble by irradiation produce structures.

The search is therefore also on for polymers suitable as photoresists.

It is an object of the present invention to find polymers suitable for producing coatings and moldings by radiation curing.

We have found that this object is achieved by the polymers defined above. We have also found processes for producing the polymers and uses of the polymers.

The novel polymers contain preferably from 0.05 to 100% by weight, particularly preferably from 0.5 to 100% by weight and, with very particular preference, from 1 to 100% by weight of the compounds of the formula I as monomer or comonomer.

Other polymers particularly suitable for coatings and moldings are those containing from 10 to 100% by weight, from 30 to 100% by weight, from 50 to 100% by weight or from 80 to 100% by weight of the compounds of the formula I.

Preferred compounds of the formula I are those in which X, X', Y, Y', Z, Z' each independently are hydrogen, $C_1$–$C_8$-alkyl, especially $C_1$–$C_4$-alkyl, or phenyl.

With particular preference at least 4 of X, X', Y, Y', Z and Z' are hydrogen.

With very particular preference, all of the radicals are hydrogen; in other words, the compound is 2,7-dioxabicyclo[3.2.1]octane of the formula

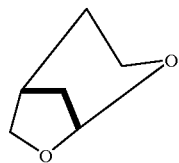

2,7-dioxabicyclo[3.2.1]octane and its derivatives can be prepared by a process which comprises
  a) subjecting a butenediol derivative to an addition reaction with a vinyl ether in the presence of a halogenating agent thus

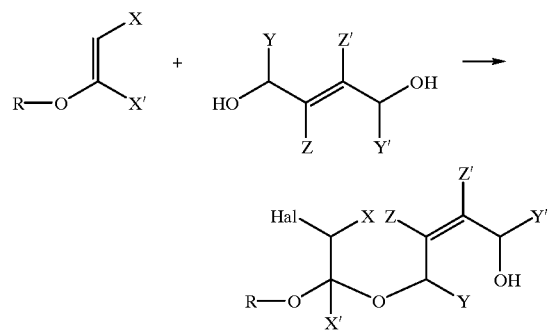

where R is a hydrocarbon radical, Hal is halogen and X, X', Y, Y', Z and Z' each independently are hydrogen or a $C_1$–$C_{20}$ hydrocarbon radical,
  b) in a second step closing the tetrahydrofuran ring thus

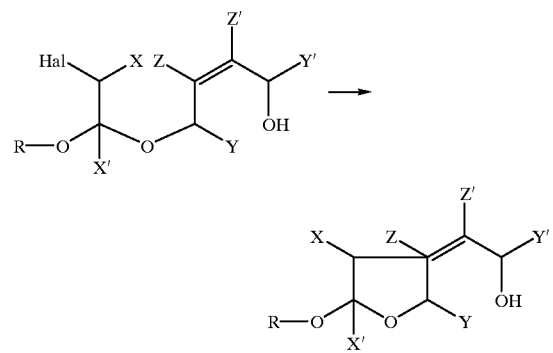

c) then eliminating the alcohol ROH thus

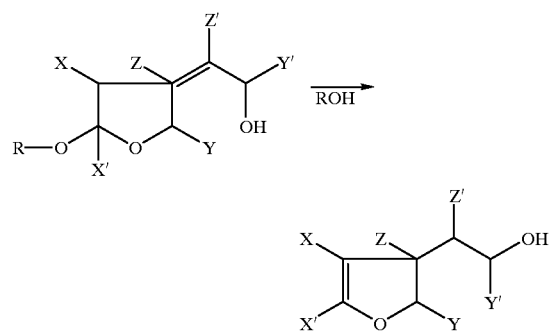

d) and effecting the ring closure to the 2,7-dioxabicyclo[3.2.1]octane or derivative thereof, thus

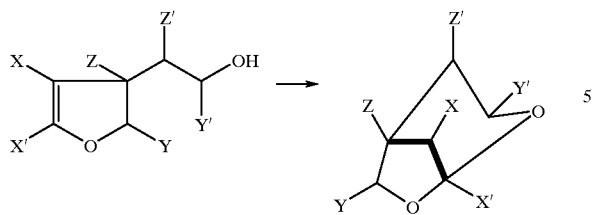

The statements made below relate to preferred embodiments of the process.

In step a) a vinyl ether, especially an alkyl vinyl ether, is reacted with a but-2-ene-1,4-diol thus

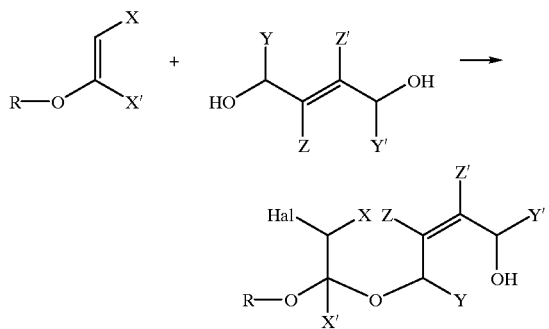

where Hal is halogen, R is a hydrocarbon radical, especially alkyl and preferably $C_1$–$C_{20}$-alkyl, and X, X', Y, Y', Z and Z' each independently are a $C_1$–$C_{20}$ hydrocarbon radical or hydrogen.

Hal is preferably bromine and R is preferably $C_1$–$C_8$-alkyl, especially $C_1$–$C_4$-alkyl and, with very particular preference, $C_2$-alkyl. X, X', Y, Y', Z and Z' each independently are preferably hydrogen or $C_1$–$C_8$-alkyl, especially $C_1$–$C_4$-alkyl, or phenyl.

With particular preference at least 4 of X, X', Y, Y', Z and Z' are hydrogen. With very particular preference, each of X, X', Y, Y', Z, Z' is hydrogen.

Step a) is preferably conducted in the presence of a halogenating agent, for example a brominating agent, especially N-bromosuccinimide.

The vinyl ether and the but-2-ene-1,4-diol derivative are preferably employed in equimolar amounts. The halogenating agent is preferably used in a molar excess, in particular of from 1.01 to 1.5 mol per mole of vinyl ether.

The reaction is generally carried out at from 0 to –30° C., in particular from –10 to –25° C.

The product (a β-haloacetal or β-bromoacetal) is obtained in high yields of, in particular, more than 70% of theory.

In step b) the tetrahydrofuran ring is closed thus

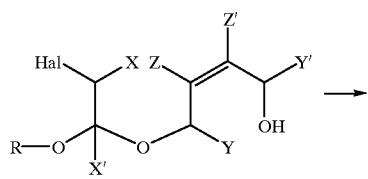

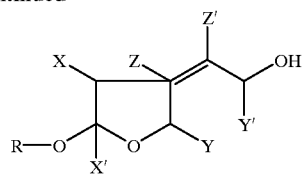

The ring closure is preferably effected by a free-radical chain reaction. Hal is preferably bromine or chlorine, especially bromine.

The reaction is preferably conducted in the presence of tin hydrides, for example tributyltin hydride (tributylstannane, $Bu_3SnH$).

For this purpose the haloacetal and tributyltin hydride are preferably employed in equimolar amounts.

The reaction is preferably conducted in the presence of free-radical initiators, such as azodiisobutyronitrile or peroxides, which are employed in substoichiometric amounts, preferably in amounts of from 1 to 30 mol-%, in particular from 5 to 20 mol-%, based on haloacetal.

The reaction is exothermic, and as a result it is generally necessary to apply only brief heating at the beginning in order to start the reaction.

Step c) involves eliminating the alcohol (R—OH) to form 3-(hydroxyethyl)-2,3-dihydrofuran thus

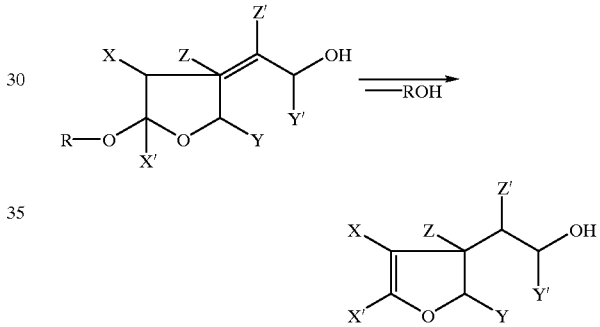

This is followed, preferably by means of acidic catalysis, by the ring closure of step d):

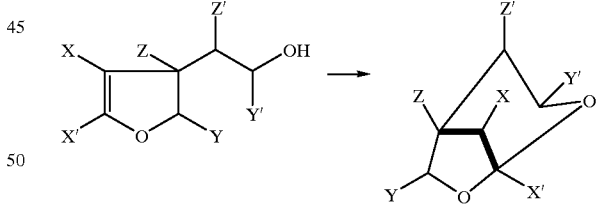

Step c) is a conventional elimination reaction which is preferably conducted in the presence of strong acids such as phosphorus pentoxide.

Simultaneously, the ring closure to form 2,7-dioxabicyclo [3.2.1]octane is catalyzed under acidic conditions.

The novel polymers may include not only compounds of the formula I but also further monomers as structural components.

Examples of further cationically polymerizable compounds are, in particular, linear or cyclic vinyl ethers, such as methyl, ethyl, propyl, isobutyl, octadecyl and cyclohexyl vinyl ethers, α-substituted vinyl ethers, as in German Patent Application P 19600342.3 or 2,3-dihydrofurans, as, for example, in German Patent Application 19610349 (O.Z. 46665).

Other compounds suitable as further cationically polymerizable compounds are epoxides, for example cyclopentene oxide, cyclohexene oxide, epoxidized polybutadiene, epoxidized soybean oil, Degacure K 126 (cyclic diepoxide) or glycidyl ethers, for example butanediol diglycidyl ether, hexanediol diglycidyl ether, e.g. bisphenol A diglycidyl ether, or pentaerythritol triglycidyl ether.

It is also possible to use cationically polymerizable monomers, such as unsaturated aldehydes and ketones, dienes such as butadiene, vinylaromatic compounds such as styrene, N-substituted vinylamines such as vinylcarbazole, and cyclic ethers, such as tetrahydrofuran.

The novel polymers can be prepared by cationic polymerization of the compounds of the formula I together, if desired, with further compounds.

The implementation of the cationic polymerization is familiar to the skilled worker.

Suitable initiators for the cationic polymerization are, in general, Lewis acids, for example complexes of $BF_3$, $AlCl_3$, $TiCl_4$ or $SnCl_4$ with water or alcohol, suitable acids being those which do not donate protons. Brönstedt acids are therefore not preferred.

The polymerization is preferably carried out at from $-78$ to $+30°$ C.

In the cationic polymerization of the compounds of the formula I the 6-membered ring is surprisingly retained. With the opening of the 5-membered ring, then, the resulting polymer contains the following structural units:

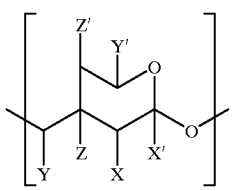

The cationic polymerization can preferably be initiated photochemically; in other words, the polymer is prepared by radiation curing. This is done by adding an initiator of cationic photopolymerization to the compounds that are to be polymerized.

Photoinitiators for cationic photopolymerization give acids when irradiated with UV light; examples that may be mentioned are aryldiazonium, aryliodonium or arylsulfonium salts, disulfones, diazo disulfones, imido-triflates, and benzoin tosylates of the following structures:

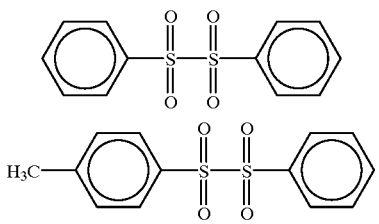

Further examples are p-methoxybenzenediazonium hexafluorophosphate, benzenediazonium tetrafluoroborate, toluenediazonium tetrafluoroarsenate, diphenyliodonium hexafluoroarsenate, triphenylsulfonium hexafluorophosphate, benzenesulfonium hexafluoro phosphate, toluenesulfonium hexafluorophosphate or Degacure KI85 (bis[4-diphenyl-sulfonio-phenyl]sulfide-bishexafluorophosphate), isoquinolinium salts, phenylpyridinium salts or picolinium salts, for example N-ethoxyisoquinolinium hexafluorophosphate, N-ethoxy-4-phenylpyridinium hexafluorophosphate or N-ethoxy-2-picolinium hexafluorophosphate. Also suitable are ferrocenium salts (e.g. Irgacure 261 from Ciba) or titanocenes.

Particularly suitable photoinitiators for the cationic photopolymerization of the novel polymers are those which do not give off Brönsted acids, i.e. no proton acids.

Examples of particularly suitable photoinitiators are ferrocenium salts such as Irgacure 261.

The novel polymers are used in particular for producing coatings and moldings.

For this purpose the compounds to be polymerized, alone or together with additives that are customary for the respective application (referred to together as radiation-curable compositions), can be applied to the substrates that are to be coated, or brought into the desired shape, and then cured by irradiation with high-energy light.

Examples of the additives are the abovementioned photoinitiators, which are preferably used in an amount of from 0.5 to 5% by weight based on the compounds that are to undergo cationic polymerization, examples of further additives being leveling agents, reinforcing substances, pigments and fillers.

Radiation curing is preferably effected with UV light. Such light is suitably generated, for example, by UV lamps with a wavelength range of from 240 to 400 nm and an output of from 50 to 240 W/cm.

The radiation-curable compositions are suitable with particular preference for producing coatings on wood, plastic, paper or metal, and are crosslinked, i.e. cured, by means of electron beams or, following the addition of photoinitiators, by UV radiation to give coatings which conform to the requirements made of protective or decorative coatings.

The radiation-curable compositions are of high reactivity; in other words, they allow for a high curing speed during radiation curing.

The novel polymers are also particularly suitable for producing structured (patterned) coatings and moldings.

The novel polymers can easily be depolymerized into the starting compounds, i.e. the compounds of the formula I.

Depolymerization can be initiated photochemically, for example by UV light. For this purpose a photoinitiator is preferably added to the polymer.

In this case the photoinitiator is preferably a compound which gives off a Brönsted acid, i.e. a protic acid, examples being N-ethoxy-2-picolinium hexafluorophosphate and aryliodonium or arylsulfonium salts.

Depolymerization can preferably be effected at from $-30$ to $+50°$ C., particularly preferably at from 0 to 30° or at room temperature from 15 to 25° C.

In order to produce structured coatings or moldings, therefore, it is possible first of all to prepare coatings and moldings, for example by radiation curing, which consist at least in part of the novel polymers. Structuring can then be generated by depolymerization of, say, parts of the polymer (parts not to be depolymerized can be masked, for example, and thus protected against high-energy radiation) and subsequent removal of the depolymerized compounds.

The novel polymers are therefore also suitable as photoresists and particularly suitable for stereolithographic applications, for producing components for microelectronics, for example microprocessors, or for producing micromoldings with, for example, a maximum diameter of less than 1 mm.

EXAMPLES

Preparing 2,7-dioxabicyclo[3.2.1]octane

Step a): β-Bromoacetal 1 mol of ethyl vinyl ether and 1 mol of but-2-ene-1,4-diol are weighed out and cooled to −20° C. Under nitrogen, 1.1 mol of N-bromosuccinimide are added, and the mixture is then stirred for 60 minutes each at −20° C. and at room temperature. The white suspension is slurried with 300 ml of water and the organic phase is separated off. The aqueous phase is subjected to extraction by shaking with methylene chloride and the combined organic phases are washed with 1-normal sodium hydroxide solution and dried over magnesium sulfate; finally, the solvent is removed by distillation on a rotary evaporator.

The crude product is purified by vacuum distillation to give a water-clear oil in a yield of 76% of theory.

Boiling point: 109° C. under 0.04 torr; $^1$H-NMR (CDCl$_3$; ppm):

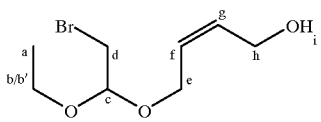

1.2 (a 3H); 2.2 (i 1H); 3.4 (d 2H); 3.6 and 3.7 (b and b' 2H); 4.2 (e and h 4H); 4.7 (c 1H); 5.6 to 5.9 (f and g 2H); $^{13}$C-NMR (CDCl$_3$; ppm):

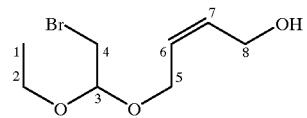

15 (1); 31 (4); 58 (8); 62 (2 signals still just resolved; (2 and 5); 101 (3); 128, 129, 131, 133 (6) and (7) cis and trans; IR (film; cm$^{-1}$): 3418, 3026, 2976, 2881, 1423, 1374, 1346, 1187, 1122, 1036, 682.

Step b): 2-Ethoxy-4-(2-hydroxyethyl)-tetrahydrofuran:

0.76 mol of "β-bromoacetal" is introduced into the reaction vessel together with one mole percent of azodiisobutyronitrile in 300 ml of absolute benzene. 0.76 mol of tributyltin hydride dissolved in 200 ml of benzene is slowly added dropwise. The mixture is heated briefly to begin with until the reaction takes off. The subsequent reaction proceeds with vigorous exothermy.

After the end of the addition stirring is continued until the exothermic reaction is at an end (about one hour). The batch is then heated at boiling for 90 minutes.

The solvent is distilled off on a rotary evaporator and the residue is taken up in acetonitrile and then extracted by shaking with n-hexane.

The solution is concentrated on a rotary evaporator and then the crude product is distilled under reduced pressure to give a yield of 65% of theory.

For further purification, the product is stored at −25° C. for several days and then filtered rapidly with suction through a deep-frozen frit. Subsequent purification is by column chromatography (eluent: ethyl acetate/n-hexane 1:1), giving a yield of 26% of theory.

Boiling point: 85° C. under 0.04 mbar; $^1$H-NMR (CDCl$_3$; ppm):

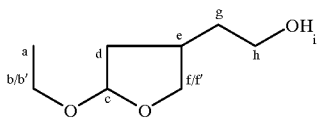

1.2 (a 3H); 1.4 to 1.8 (d and g 4H); 1.9 (i 1H); 2.3 (e 1H); 3.4 to 3.5 (b and b' 2H); 3.6 (h 2H); 3.8 and 4.0 (f and f' 2H); 5.1 (c 1H); $^{13}$C-NMR (CDCl$_3$; ppm):

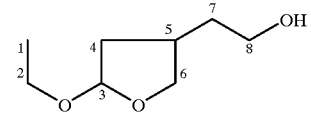

15 (1), 35 and 36 (4) and (7); 39 (5); 62 (8), 63 (2), 72 (6), 104 (3); IR (film; cm$^{-1}$): 3421, 2930, 2872, 1374, 1345, 1182, 1110, 1054.

Steps c) and d): 2.7-Dioxabicyclo[3.2.1]octane:

A spatula tip of phosphorus pentoxide was added to 44 mmol of 2-ethoxy-4-(2-hydroxyethyl)tetrahydrofuran, and the flask was immediately closed with a short distillation bridge and lowered into an oil bath preheated to 80° C. The vacuum is set at 0.05 mbar and the receiver is cooled with liquid nitrogen.

After the end of distillation, 20 ml of 50% strength sodium hydroxide solution are added to the receiver, and only after this has been done is the receiver removed from the liquid nitrogen.

After the contents of the receiver have thawed, they are subjected to extraction with ether, and the organic phase is dried over sodium carbonate after which the solvent is stripped off under reduced pressure to give a yield of 68% of theory.

$^1$H-NMR (d$_6$-acetone; ppm):

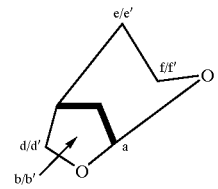

2.45 and 2.6 (b and b' 2H); 2.75 to 2.9 (e and e' 2H); 2.5 (c 1H); 3.6 and 4.0 (f and f' 2H); 4.75 to 4.85 (d and d' 2H); 5.2 (a 1H); $^{13}$C-NMR (d$_6$-acetone; ppm):

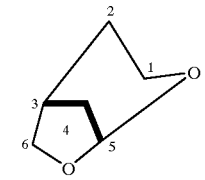

31 (2); 33 (3); 39 (4); 60 (1); 73 (6); 100 (5); IR (film; cm$^{-1}$): 2945, 2879, 1454, 1384, 1273, 1242, 1178, 1153, 1080, 1049, 1011, 995, 933, 908, 873, 826, 810, 759.

Polymerizing 2,7-dioxabicyclo[3.2.1]octane 624 mg of 2,7-dioxabicyclo[3.2.1]octane (3 mol/l) and 7.7 mg of Irgacure® 261 as photoinitiator (10 mmol/l) are dissolved in 2 ml of methylene chloride, and the solution is subjected to irradiation with UV light for 10 minutes.

The polymer is purified by precipitation from n-hexane.
Spectroscopic data for the polymer:
$^1$H-NMR (CDCl$_3$; ppm):

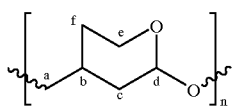

1.0 to 2.0 (c and f 4H); 2.0 to 2.7 (b 2 1H); 3.0 to 4.2 (a and e 4H); 4.3 to 5.2 (d 1H); $^{13}$C-NMR(CDCl$_3$; ppm):

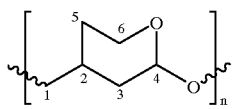

30 (3); 33 (2); 35 (5); 59 (6); 71 (1); 97 (4); IR (film; cm$^{-1}$): 2922, 1445, 1384, 1340, 1252, 1184, 1124, 1074, 1047, 989, 914, 860.

Depolymerizing poly(2,7-dioxabicyclo[3.2.1]octane)

10 mg of poly(2,7-dioxabicyclo[3.2.1]octane) (0.09 mmol of repeating units) and 0.009 mmol of N-ethoxy-2-picolinium-hexafluorophosphate (10 mol-%) are dissolved in 2 ml of wet methylene chloride and the solution is subjected to irradiation with UV light for 10 minutes.

The entire contents of the cuvette are transferred to a flask and the solvent is removed by distillation on a rotary evaporator. A $^1$H-NMR spectrum of the residue is recorded, and is found to be identical with that of 2,7-dioxabicyclo[3.2.1]octane (28).

We claim:

1. A polymer of a 2,7-dioxabicyclo[3.2.1]octane compound of the formula

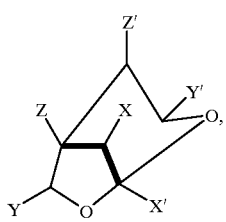

I where X, X', Y, Y', Z and Z' each independently are a C$_1$–C$_{20}$ hydrocarbon radical or hydrogen.

2. A polymer as claimed in claim 1 containing from 0.05 to 100% by weight of monomeric or comonomeric units of a compound of the formula I.

3. A polymer as claimed in claim 1 wherein at least four of X, X', Y, Y', Z and Z' in formula I are hydrogen.

4. A polymer as claimed in claim 1 wherein the compound of the formula I is 2,7-dioxabicyclo[3,2.1]octane.

5. A process for preparing a polymer as claimed in claim 1, which comprises subjecting a compound of the formula I to cationic polymerization.

6. A process as claimed in claim 5, wherein the cationic polymerization is initiated photochemically.

7. A coating upon a substrate or a molding comprising a polymer as claimed in claim 1.

8. A process for producing a structured coating upon a substrate or a molding, wherein the coating or the molding comprises a polymer as claimed in claim 1 which comprises depolymerizing said polymer to form the structure.

9. A process as claimed in claim 8, wherein the depolymerization is effected by high-energy light in the presence of a Brönstedt acid, i.e. a proton-donating acid.

10. A structured coating on a substrate or a structured molding comprising a polymer as claimed in claim 1.

11. A photoresist comprising a polymer as claimed in claim 1.

12. A printing plate comprising a polymer as claimed in claim 1.

13. A micromolding comprising a polymer as claimed in claim 1.

14. A microelectronic component comprising a polymer as claimed in claim 1.

15. The process for producing a coating on a substrate which comprises applying a composition comprising a 2,7-dioxabicyclo[3.2.1]octane compound of the formula

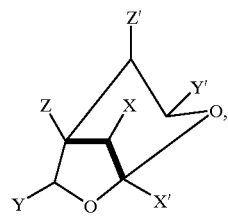

I in which X, X', Y, Y', Z and Z' each independently are a C$_1$–C$_2$ hydrocarbon radical or hydrogen to the substrate and radiation curing the applied coating.

16. The process for producing a molding which comprises radiation curing a shaped composition comprising a 2,7-dioxabicyclo[3.2.1]octane compound of the formula

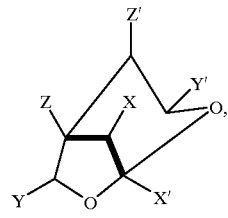

I in which X, X', Y, Y', Z and Z' each independently are a C$_1$–C$_2$ hydrocarbon radical or hydrogen.

* * * * *